(12) United States Patent
Kim

(10) Patent No.: US 8,530,747 B2
(45) Date of Patent: Sep. 10, 2013

(54) METHOD FOR MANUFACTURING MULTILAYERED FLEXIBLE CIRCUIT BOARD

(75) Inventor: Kanghee Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 229 days.

(21) Appl. No.: 13/027,606

(22) Filed: Feb. 15, 2011

(65) Prior Publication Data

US 2012/0021621 A1    Jan. 26, 2012

(30) Foreign Application Priority Data

Jul. 26, 2010    (KR) .................. 10-2010-0072115

(51) Int. Cl.
*H05K 1/14*    (2006.01)
*H05K 3/36*    (2006.01)

(52) U.S. Cl.
USPC ............... 174/254; 174/260; 439/65; 439/67; 361/752

(58) Field of Classification Search
USPC ..................... 361/755, 752, 749; 174/254
See application file for complete search history.

(56) References Cited

U.S. PATENT DOCUMENTS

| | | | | |
|---|---|---|---|---|
| 5,917,158 A * | 6/1999 | Takao et al. | ................... | 174/254 |
| 7,698,811 B2 * | 4/2010 | Yang et al. | ...................... | 29/829 |
| 7,728,232 B2 * | 6/2010 | Huang et al. | ................... | 174/254 |
| 2004/0160748 A1 * | 8/2004 | Takagi et al. | ................... | 361/752 |
| 2006/0050490 A1 * | 3/2006 | Ootani | ......................... | 361/755 |
| 2008/0047134 A1 * | 2/2008 | Tsurusaki et al. | .............. | 29/829 |

* cited by examiner

*Primary Examiner* — Hoa C Nguyen
*Assistant Examiner* — Amol Patel
(74) *Attorney, Agent, or Firm* — Birch, Stewart, Kolasch & Birch, LLP

(57) ABSTRACT

Disclosed herein is a method of manufacturing a multilayered flexible circuit board. The method of manufacturing a multilayered flexible circuit board may include integrally forming a first flexible printed circuit board and a second flexible printed circuit board divided in a symmetrical shape with respect to a reference line on the same plane to provide an original plate; attaching the first flexible printed circuit board to the second flexible printed circuit board by folding the original plate with respect to the reference line; and electrically connecting the first flexible printed circuit board to the second flexible printed circuit board.

6 Claims, 7 Drawing Sheets

METHOD FOR MANUFACTURING MULTILAYERED FLEXIBLE CIRCUIT BOARD

CROSS-REFERENCE TO RELATED APPLICATION

Pursuant to 35 U.S.C. §119(a), this application claims the benefit of earlier filing date and right of priority to Korean Application No. 10-2010-0072115, filed on Jul. 26, 2010, the contents of which is incorporated by reference herein in its entirety.

BACKGROUND OF THE INVENTION

1. Field of the Invention

The present invention relates to a method of manufacturing a multilayered flexible circuit board, a multilayered circuit board manufactured thereby, and a portable terminal having the same.

2. Background of the Invention

A flexible printed circuit board is a board on which copper is adhered on an insulation film (in this aspect, also referred to as a flexible copper clad laminate (FCCL)), in which fine patterns can be easily formed with high flexibility, thereby continually increasing the applications to electronic products, measuring instruments, automobiles, aircrafts, and the like.

In particular, a flexible printed circuit board, which is freely flexible in any direction, has been mainly used as a connecting means for not obstructing electrical connections between the main body and the display unit during repetitive opening and closing operations in a folder-type portable terminal.

The flexible printed circuit board may be formed in the form having a plurality of layers as increasing the number of objects to be connected thereto or increasing the integration level of a circuit.

The production cost of a flexible printed circuit board manufactured with more than four layers tends to increase far more than that of a board merely manufactured with two layers, and also it has a problem of increasing the length to thickness thereof.

SUMMARY OF THE INVENTION

The present disclosure is contrived to solve the foregoing problems, and one aspect of the present disclosure is to provide a method of manufacturing a multilayered flexible circuit board capable of reducing the production cost.

In order to solve the foregoing objective, a method of manufacturing a multilayered flexible circuit board associated with the present disclosure may include integrally forming a first flexible printed circuit board and a second flexible printed circuit board divided in a symmetrical shape with respect to a reference line on the same plane to provide an original plate; attaching the first flexible printed circuit board to the second flexible printed circuit board by folding the original plate with respect to the reference line; and electrically connecting the first flexible printed circuit board to the second flexible printed circuit board.

Said forming a first flexible printed circuit board and a second flexible printed circuit board may include forming an insulating layer; forming a first circuit pattern layer on a first surface of the insulating layer; and forming a second circuit pattern layer on a second surface of the insulating layer.

Said attaching a first flexible printed circuit board and a second flexible printed circuit board may include coating an adhesive layer between the first flexible printed circuit board and the second flexible printed circuit board.

The method may further include attaching a connector to at least one end portion of the first flexible printed circuit board and second flexible printed circuit board subsequent to electrically connecting the first flexible printed circuit board to the second flexible printed circuit board.

Said forming a first flexible printed circuit board and a second flexible printed circuit board may include forming a conductive via hole or through hole to face each other during the process of attaching the first flexible printed circuit board and the second flexible printed circuit board, respectively.

The method may further include attaching an external insulating layer to an outer surface of the first flexible printed circuit board and an outer surface of the second flexible printed circuit board subsequent to electrically connecting the first flexible printed circuit board to the second flexible printed circuit board.

Said forming a first flexible printed circuit board and a second flexible printed circuit board may include forming a plurality of first flexible printed circuit boards and a plurality of second flexible printed circuit boards corresponding to each of the first flexible printed circuit boards with respect to a reference line on the one original plate.

According to the present disclosure, there is disclosed a method of manufacturing a multilayered flexible circuit board including preparing a first roll, sequentially formed with first unit flexible printed circuit boards, in which a first circuit pattern is formed on one surface thereof and a second circuit pattern is formed on the other surface thereof; preparing a second roll, sequentially formed with second unit flexible printed circuit boards formed in a shape symmetrical to the first flexible printed circuit boards, in which a third circuit pattern is formed on one surface thereof and a fourth circuit pattern is formed on the other surface thereof; and rotatably supplying the first roll and the second roll to attach the first flexible printed circuit board and the second flexible printed circuit board to be matched to each other.

According to the present disclosure, there is disclosed a multilayered flexible circuit board including a first flexible printed circuit board in which a first circuit pattern is formed on one surface thereof and a second circuit pattern is formed on the other surface thereof; a second flexible printed circuit board layered on the first flexible printed circuit board, in which a third circuit pattern is formed on one surface thereof and a fourth circuit pattern is formed on the other surface thereof; and a folding portion formed at either one end portion of a layered body of the first flexible printed circuit board and second flexible printed circuit board to connect the first flexible printed circuit board and the second flexible printed circuit board in a folding shape.

According to the present disclosure, there is disclosed a portable terminal, including a first body; a second body configured to move with respect to the first body to be foldably connected thereto; and a flexible printed circuit board configured to electrically connect the first body and the second body, wherein the flexible printed circuit board may include a first flexible printed circuit board in which a first circuit pattern is formed on one surface thereof and a second circuit pattern is formed on the other surface thereof; a second flexible printed circuit board layered on the first flexible printed circuit board, in which a third circuit pattern is formed on one surface thereof and a fourth circuit pattern is formed on the other surface thereof; and a folding portion formed at either one end portion of a layered body of the first flexible printed circuit board and second flexible printed circuit board to connect the first flexible printed circuit board and the second flexible printed circuit board in a folding shape.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, a method of manufacturing a multilayered flexible circuit board associated with the present invention, a multilayered circuit board manufactured thereby, and a portable terminal having the same will be described in more detail with reference to the accompanying drawings. The suffixes "module" and "unit or portion" for components used in the following description merely provided only for facilitation of preparing this specification, and thus they are not granted a specific meaning or function.

Figure 1:
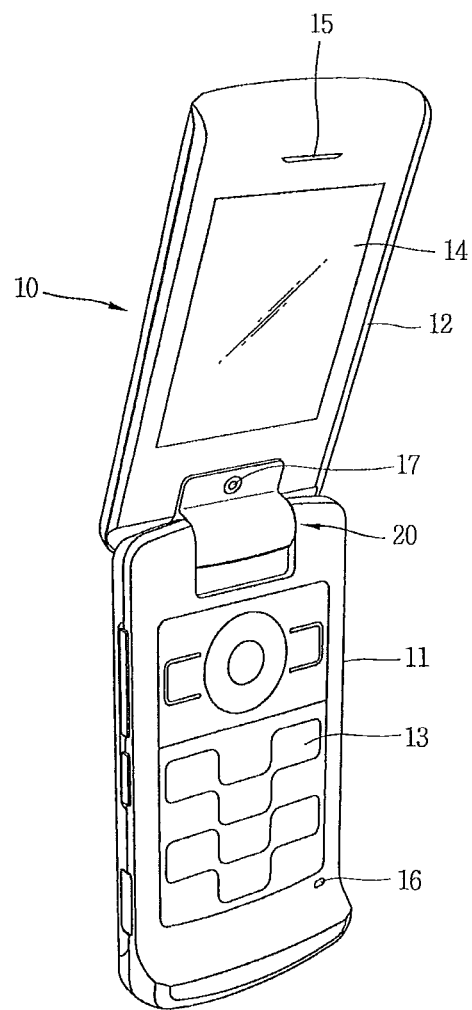
FIG. 1 is a perspective view illustrating a folder-type portable terminal as an example to which a multilayered flexible circuit board associated with the present invention may be applicable.
Figure 2:
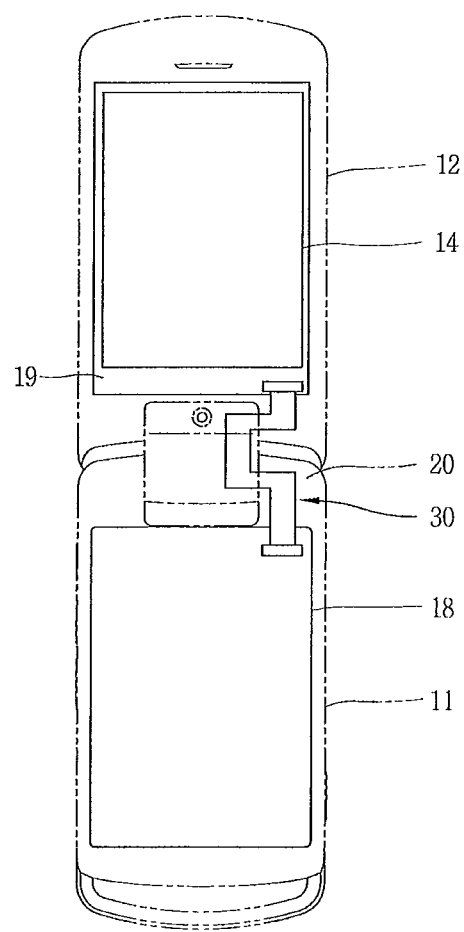
FIG. 2 is a plan view illustrating a multilayered flexible circuit board provided in the portable terminal of FIG. 1.

FIG. 1 is a perspective view illustrating a folder-type portable terminal as an example to which a multilayered flexible circuit board associated with the present invention may be applicable, and FIG. 2 is a plan view illustrating a multilayered flexible circuit board provided in the portable terminal of FIG. 1.

Referring to FIG. 1, a portable terminal 10 may include a first body 11 and a second body 12 foldably connected to each other. However, a multilayered flexible circuit board associated with the present invention may be applicable to any type of mobile terminals such as slide-type or bar-type, which is not shown in FIG. 1, and moreover, may be applicable to various electronic devices.

The configuration in which the two bodies are completely overlapped with each other may be referred to as a closed configuration, and the configuration in which the inner surfaces of the first body 11 and second body 12 are exposed by rotating the second body 12 with respect to the first body 11 may be referred to as an open configuration.

The portable terminal 10, together with another terminal located apart therefrom, and a base station or a relay station, form a wireless network. Through the portable terminal 10, the user may perform voice/video or text communication with another terminal or may perform Internet functions in a wireless manner. Moreover, the portable terminal 10 has a means capable of receiving radio broadcast or TV broadcast in a wireless manner, and thus the user may enjoy broadcast at any place where he or she is located.

An audio output unit 15, a video input unit 17 and a display 14 are provided at an inner surface of the second body 12.

The video input unit 17 may be implemented in the form a camera module for capturing an image or video for the user, or the like. The audio output unit 15 may be implemented in the form of a speaker, a receiver, and the like.

The display 14 may include a liquid crystal display (LCD), an organic light emitting diodes (OLED) display, a transparent display, an e-paper display, or the like. The display 14 may further include a touch detection member to allow the input of information by the user's touch.

A keypad 13 and an audio input unit 16 may be mounted at an inner surface of the first body 11, and a side key, an external interface, and the like may be provided at a lateral surface thereof.

The keypad 13 or side key may be commonly referred to as a manipulating portion, and any method may be employed if it is a tactile manner allowing the user to perform manipulation with a tactile feeling. For example, the manipulating portion may be implemented as a dome switch, touch screen, or touch pad capable of receiving commands or information by the user's push or touch manipulation, or may be implemented in the manner of manipulating a wheel, a jog or a joystick to rotate keys.

From a functional viewpoint, the keypad 13 is provided to input characters or numerals, or input commands such as START, END, SCROLL and the like, and the side key may operate as a hot key for performing a specific function such as adjusting an adjustable amount of state (volume, brightness, menu search, etc.), activating the video input unit 17, and the like.

Referring to FIGS. 1 and 2, the first body 11 and the second body 12 are connected by a hinge 20. The hinge 20 may implement an open configuration such as about 130 degrees for phone communication, 90 degrees for image capture, and the like. For the hinge 20, an elastic unit may be provided to control an opening angle of the second body 12 or a stopper device may be provided to control a repose angle thereof.

As illustrated in FIG. 2, a flexible printed circuit board assembly 30 is provided to electrically connect the first body 11 to the second body 12. The flexible printed circuit board assembly 30 requires sufficient flexibility and durability to maintain the electrical connectivity of the first body 11 and the second body 12 while the second body 12 is repetitively opened and closed. In particular, the flexible printed circuit board assembly 30 passes through the hinge 20 to connect the first body 11 to the second body 12 without being exposed to the outside. For this purpose, the flexible printed circuit board assembly 30 is provided with a shape matched to the structure or arrangement of the first body 11 and second body 12.

Figure 3:
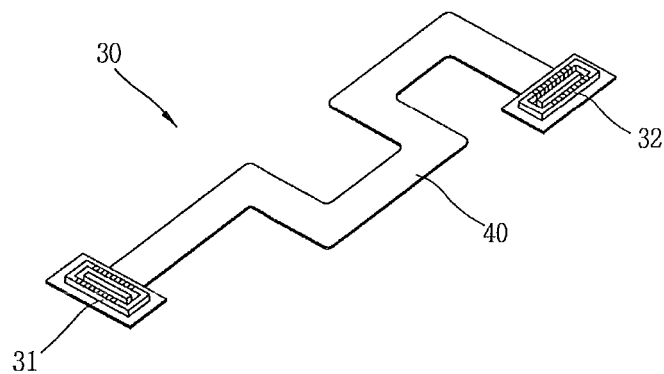
FIG. 3 is a perspective view illustrating the multilayered flexible circuit board of FIG. 2.

FIG. 3 is a perspective view illustrating the multilayered flexible circuit board of FIG. 2. As described above, the flexible printed circuit board assembly 30 may have any form matched to the inner shape or condition of a device to be mounted thereon, and as illustrated in FIG. 3, may have a form that it is extended in one direction and at least part thereof is bent.

A flexible printed circuit board 40 may be formed in the structure having a plurality of layers as increasing the number of objects to be connected. In particular, as illustrated in FIG. 1, it may requires a greater number of layers as increasing the number of connection objects such as connections between the first body 11 and the second body 12—connection between a main circuit board 18 and a display 14, connection between a main circuit board 18 and a camera 17, etc. A multilayered flexible printed circuit board may be applicable to a precision component or apparatus having a high integration level.

Both ends of the flexible printed circuit board 40 are adhered to the connectors 31, 32, and those connectors 31, 32 are formed to be plugged into the receptacles of the first body 11 and second body 12, respectively.

Figure 4:
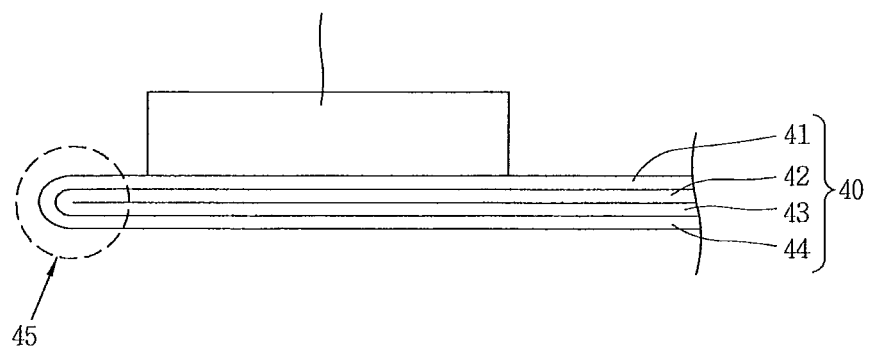
FIG. 4 is a side view illustrating an end of the multilayered flexible circuit board of FIG. 3.

FIG. 4 is a side view illustrating an end of the multilayered flexible circuit board of FIG. 3. The flexible printed circuit board 40 may have a structure in which a first circuit pattern layer 41, and a second circuit pattern layer 42, a third circuit pattern layer 43, and a fourth circuit pattern layer 44 are layered thereon. According to the present disclosure, the first circuit pattern layer 41 and second circuit pattern layer 42 are folded with the third circuit pattern layer 43 and fourth circuit pattern layer 44, in particular, in order to have such four layers. It may be confirmed by a folding portion 45 at which an end of the flexible printed circuit board 40 is shown.

In the shape of installation, if the first circuit pattern layer 41 is positioned at one surface of an insulating layer (not shown in detail), then the second circuit pattern layer 42 is positioned at an opposite surface of the insulating layer. In other words, the insulating layer may be formed of a resin such as polyimide which is previously well known. The first circuit pattern layer 41 and second circuit pattern layer 42 are obtained by forming a predetermined pattern on a copper film coated on the insulating layer and then performing etching or the like thereon. The second circuit pattern layer 42 may be obtained by forming the first circuit pattern layer 41 on the insulating layer and then forming it on an opposite surface thereof, or obtained by forming it together with the first circuit pattern layer 41 at the same time. The third circuit pattern layer 43 and fourth circuit pattern layer 44 may be also obtained by forming them on both surfaces opposite to each other of one insulating layer.

Accordingly, for the folded flexible printed circuit board 40, it may be understood that circuit patterns are implemented on both surfaces of two portions of the insulating layers in a state that one insulating layer is folded. In this case, the second circuit pattern layer 42 and third circuit pattern layer 43 may be insulated by another unfolded insulating layer.

A multilayered flexible circuit board 40 in a folded form provides various effects in production cost and quality. In the aspect of production cost, if a four-layered flexible printed circuit board is manufactured, then the overall process can be greatly simplified with a process of forming each circuit pattern on both surfaces of one insulating layer and then folding it, contrary to an existing process, in which a circuit pattern is formed on one insulating layer to form a layer of flexible printed circuit board, and a second insulating layer is formed again on the flexible printed circuit board and then a second circuit pattern is formed to obtain a second flexible printed circuit board, and a third insulating layer is formed and then a third circuit pattern is formed to obtain a third flexible printed circuit board, and a fourth insulating layer is formed and then a fourth circuit pattern is formed to obtain a fourth flexible printed circuit board. As a result, it provides an advantage of reducing consumed materials and the resultant cost and processes. Moreover, the consumption of insulating layers is reduced, thereby also decreasing the thickness of a flexible printed circuit board.

Figure 5:
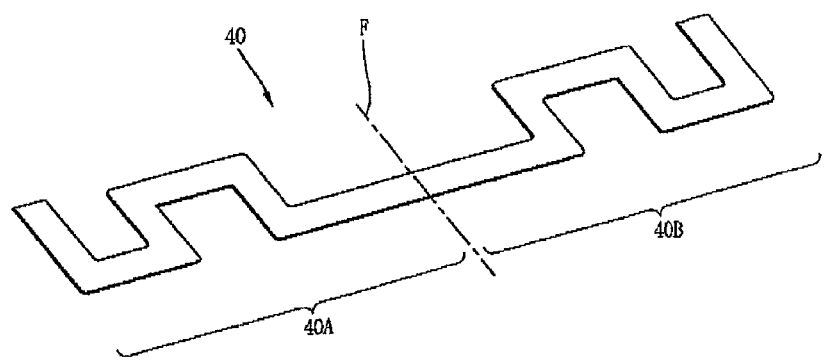
FIG. 5 is a perspective view illustrating an original plate of the multilayered flexible circuit board provided to manufacture the multilayered flexible circuit board associated with the present invention.

Hereinafter, a process of manufacturing a multilayered flexible circuit board associated with the present invention will be described with reference to FIG. 5. FIG. 5 illustrates an original plate 40 in which a first flexible printed circuit board 40A and a second flexible printed circuit board 40B to be folded with each other are integrally formed in a symmetrical manner to manufacture a multilayered flexible circuit board.

The first flexible printed circuit board 40A and second flexible printed circuit board 40B are integrally formed on the same plane as a shape on which each circuit pattern is formed on an upper and a lower surfaces of the foregoing insulating layer. In other words, the first flexible printed circuit board 40A and second flexible printed circuit board 40B are manufactured through the same process as the layers forming a multilayered flexible circuit board. In this respect, it differs from the example of the related art in which individual layers are manufactured in different steps.

The first flexible printed circuit board 40A and second flexible printed circuit board 40B may have any shape that is matched to the condition where it will be applied, and may be divided with respect to the reference line (F). The first flexible printed circuit board 40A and second flexible printed circuit board 40B may be formed in a symmetrical form in the aspect of its shape. However, it may be is possible to have cases where they are not symmetrical according to the attachment position of a connector and its application thereof.

Figure 6:
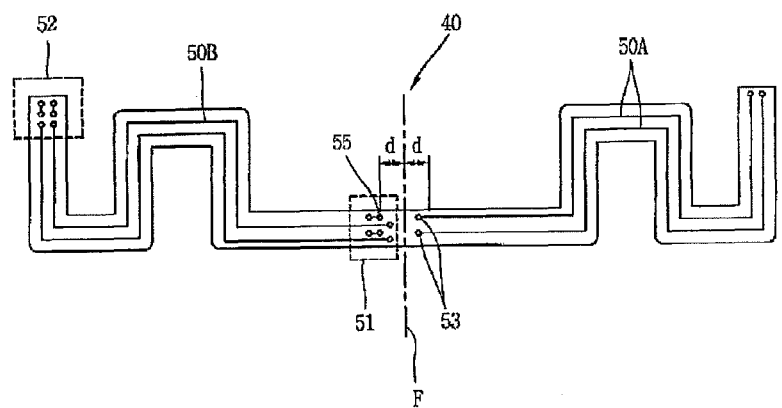
FIG. 6 is a plan view illustrating an example of a circuit pattern on a first flexible printed circuit board and a second flexible printed circuit board.

FIG. 6 is a plan view illustrating an example of a circuit pattern on a first flexible printed circuit board and a second flexible printed circuit board. A plurality of line-shaped conductive patterns 50A, 50B may be formed on the first flexible printed circuit board 40A and second flexible printed circuit board 40B. The conductive patterns 50A, 50B are one of the detailed shapes of the first circuit pattern layer 41 through the fourth circuit pattern layer 44. Here, it conceptually and simply represents a case where the first flexible printed circuit board 40A and second flexible printed circuit board 40B are used as a means for electrically connecting two bodies.

The first flexible printed circuit board 40A or second flexible printed circuit board 40B may include a region to which a connector is attached in the future. The region may be formed at either one or both of the first flexible printed circuit board 40A and second flexible printed circuit board 40B. In FIG. 6, it is illustrated an example that two regions 51, 52 are formed at the second flexible printed circuit board 40B. The conductive patterns 50A, 50B of the second flexible printed circuit board 40B to which a connector is directly attached can be directly connected to the connectors 31, 32, but the conductive patterns 50A, 50B of the first flexible printed circuit board 40A positioned at an opposite side thereof cannot be directly connected to the connectors 31, 32 when folded, and thus conductive via holes or through holes 53, 55 are formed to connect them to each other. In other words, a first conductive via hole or through hole 53 is formed on the first flexible printed circuit board 40A in FIG. 6, and a second conductive via hole or through hole 55 is formed on the second flexible printed circuit board 40B. They are positioned at the same distance (d) from the reference line (F), and thus they are brought into touch with each other to be electrically conducted when folded.

Figure 7:
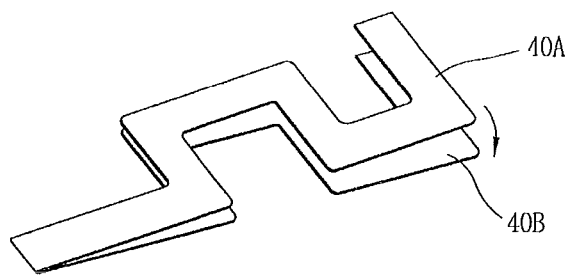
FIG. 7 is a conceptual view illustrating that a first flexible printed circuit board and a second flexible printed circuit board are folded to be attached to each other.

FIG. 7 is a conceptual view illustrating that a first flexible printed circuit board and a second flexible printed circuit board are folded to be attached to each other, and the first flexible printed circuit board 40A is attached to the second flexible printed circuit board 40B by folding an original plate in which the first flexible printed circuit board 40A and second flexible printed circuit board 40B are integrally formed as illustrated in FIGS. 5 and 6.

For the attachment process, an insulating adhesive layer may be coated between the first flexible printed circuit board 40A and the second flexible printed circuit board 40B. The adhesive layer will be excluded from the surroundings of the via holes or through holes 53, 55 described in the above to electrically connect the first flexible printed circuit board 40A to the second flexible printed circuit board 40B during the attachment process.

Subsequent to attaching and electrically connecting the first flexible printed circuit board 40A to the second flexible printed circuit board 40B, an external insulating layer can be adhered to an outer surface of the first flexible printed circuit board 40A and an outer surface of the second flexible printed circuit board 40B. The external insulating layer may be referred to as a cover layer, and the external insulating layer is excluded from a portion to which the connectors 31, 32 will be adhered.

In this manner, the two layered first flexible printed circuit board 40A and second flexible printed circuit board 40B are folded and attached to each other to become a four layered structure. The process may be simplified not by additionally layering on the first flexible printed circuit board 40A or second flexible printed circuit board 40B but by immediately folding and layering them.

Figure 8:
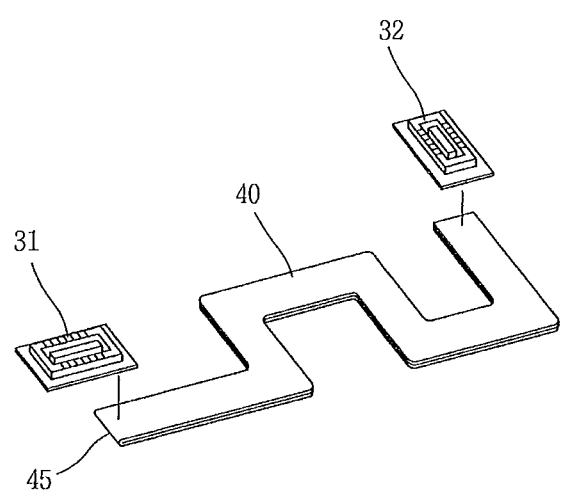
FIG. 8 is a conceptual view illustrating that a connector is adhered to a flexible printed circuit board in which the attachment has been completed.

FIG. 8 is a conceptual view illustrating that a connector is adhered to a flexible printed circuit board in which the attachment has been completed. The connectors 31, 32 may be formed in various manners according to the purpose, and moreover, may be implemented in the form of a pin or plug, which is made by exposing a conductive circuit pattern on the flexible printed circuit board 40 without being separately adhered thereon.

Figure 9:
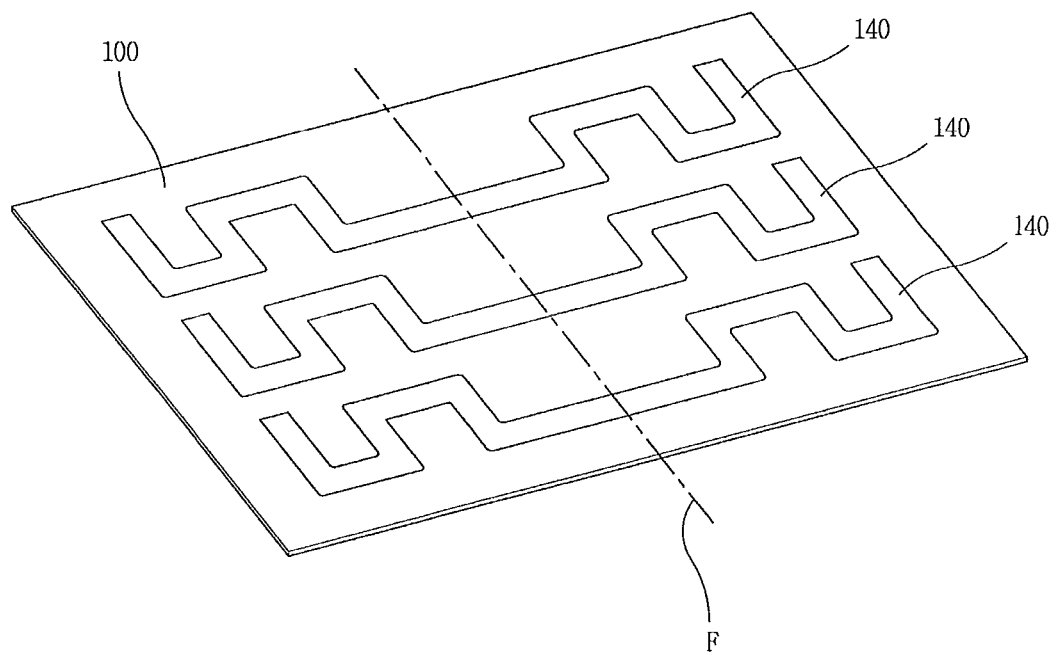
FIG. 9 is a perspective view illustrating that a plurality of multilayered flexible circuit board are formed on one original plate as another example associated with the present invention.

FIG. 9 is a perspective view illustrating that a plurality of multilayered flexible circuit board are formed on one original plate as another example associated with the present invention.

In FIG. 9, it is illustrated that a plurality of multilayered flexible circuit boards are obtained through one folding process. In other words, a plurality of multilayered flexible circuit board are obtained by forming a plurality of original flexible printed circuit board plates 140 formed in a symmetrical shape with respect to one reference line (F) on one sheet 100, and folding the sheet 100. As a result, it is advantageous in volume production.

Figure 10:
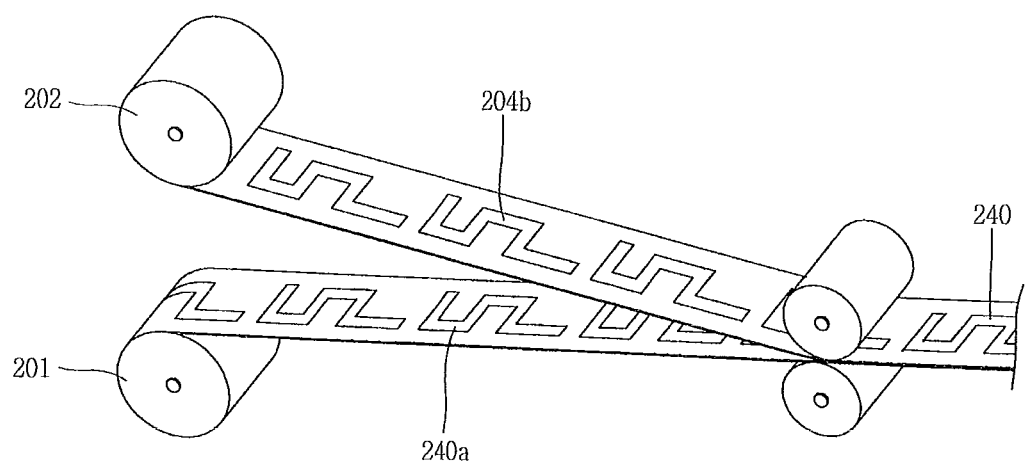
FIG. 10 is a conceptual view illustrating a method of manufacturing a multilayered flexible circuit board capable of continuous production as still another example associated with the present invention.

FIG. 10 is a conceptual view illustrating a method of manufacturing a multilayered flexible circuit board capable of continuous production as still another example associated with the present invention.

First, a first roll 201 sequentially formed with first unit flexible printed circuit boards 240A is prepared. At the same time, a second roll 202 sequentially formed with second unit flexible printed circuit boards 240B, which are formed in a shape symmetrical to the first flexible printed circuit board 240A, is also prepared.

Even at this time, a first circuit pattern is formed on one surface of the first flexible printed circuit board 240A and a second circuit pattern is formed on the other surface thereof, and a third circuit pattern is formed on one surface of the second flexible printed circuit board 240B and a fourth circuit pattern is formed on the other surface thereof, thereby obtaining a structure on which four circuit pattern layers are layered.

When the first roll 201 and the second roll 202 are rotatably supplied and the first flexible printed circuit board 240A and second flexible printed circuit board 240B are attached and matched to each other, it may allow continuous production.

Figure 11:
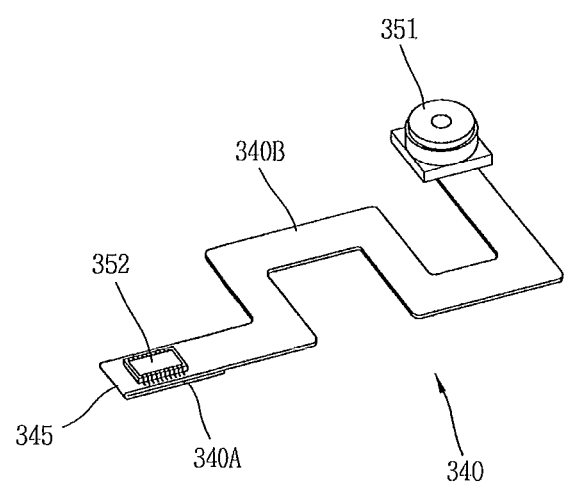
FIG. 11 is a perspective view illustrating that an electronic element is mounted on a flexible printed circuit board as yet still another example associated with the present invention.

FIG. 11 is a perspective view illustrating that an electronic element 352 is mounted on a flexible printed circuit board 340 as yet still another example associated with the present invention.

According to the drawing, the first flexible printed circuit board 340A and second flexible printed circuit board 340B are formed to be asymmetrical to each other with respect to a folding portion 345. More specifically, the first flexible printed circuit board 340A is folded to cover part of the second flexible printed circuit board 340B, and an electronic element 352 is mounted on a portion of the second flexible printed circuit board 340B being covered by the first flexible printed circuit board 340A.

For example, the electronic element 352 may be a driver for the camera module. However, the present invention will not be limited to this, and the electronic element may be any one of components mounted on a flexible printed circuit board such as a connector, a semiconductor chip, or the like.

Referring to the drawing, an end portion of the flexible printed circuit board 340 in which the attachment has been completed is connected to a camera module 351 incorporated in a main body of the mobile terminal, and a driver for the camera module 351 is mounted on the other end thereof. The first flexible printed circuit board 340A and second flexible printed circuit board 340B are folded at the other end of the flexible printed circuit board 340, thereby increasing the rigidity of the flexible printed circuit board 340. The surface mounting of the driver may be more facilitated by an increase of the rigidity. Furthermore, though not shown in the drawing, the first flexible printed circuit board 340A may be folded several times in an overlapped manner to further increase the rigidity.

In general, the flexibility of a flexible printed circuit board causes much difficulty in the surface mounting of the driver. Furthermore, there is a problem of greatly increasing the production cost when a flexible printed circuit board is manufactured with a multi-layered structure to overcome the foregoing difficulty. Accordingly, a reinforcement material such as stainless steel is mounted at a surface opposite to the surface on which the driver is surface-mounted. However, according to the flexible printed circuit board 340 in this example, such a reinforcement material will not be required.

According to a method of manufacturing a multilayered flexible circuit board associated with the present invention, for example, a four-layered flexible printed circuit board may be obtained by folding a two-layered flexible printed circuit board which can be easily manufactured. Hence, the overall process can be greatly simplified compared to the existing method in which each layer is formed one by one. As a result, it provides an advantage of reducing consumed materials and the resultant cost and processes.

Moreover, the consumption of insulating layers is reduced, thereby also decreasing the thickness of a flexible printed circuit board.

The configurations and methods according to the above-described embodiments will not be applicable in a limited way to the foregoing method of manufacturing a multilayered flexible circuit board, a multilayered circuit board manufactured thereby, and a portable terminal having the same, and all or part of each embodiment may be selectively combined and configured to make various modifications thereto.

What is claimed is:

1. A portable terminal, comprising:
   a first body;
   a second body configured to move with respect to the first body to be foldably connected thereto; and
   a flexible printed circuit board configured to electrically connect the first body and the second body,
   wherein the flexible printed circuit board comprises:
   a first flexible printed circuit board in which a first circuit pattern is formed on one surface thereof and a second circuit pattern is formed on the other surface thereof;
   a second flexible printed circuit board layered on the first flexible printed circuit board, in which a third circuit pattern is formed on one surface thereof and a fourth circuit pattern is formed on the other surface thereof;
   a folding portion formed at either one end portion of a layered body of the first flexible printed circuit board and second flexible printed circuit board to connect the first flexible printed circuit board and the second flexible printed circuit board in a folding shape; and
   an adhesive layer coated between the first flexible printed circuit board and the second flexible printed circuit board,
   wherein an attached region for attaching a connector is formed on at least one of the first and second flexible printed circuit boards, and is located nearby the folding portion,
   wherein a first conductive via hole or through hole is formed on the first flexible printed circuit board and a second conductive via hole or through hole is formed on the second flexible printed circuit board, and each of the first and second conductive via holes or through holes is touched by each other to form an electrically conductive connection, and
   wherein the adhesive layer is excluded from a surrounding of the first and second conductive via holes or through holes in the respective first and second flexible printed circuit boards to electrically connect the first flexible printed circuit board to the second flexible printed circuit board.

2. The portable terminal of claim 1, wherein each of the first and second conductive via holes or through holes is formed at a corresponding position of the first and the second flexible printed circuit board, respectively, to pass through the layered body.

3. The portable terminal of claim 1, wherein the first flexible printed circuit board is folded to cover part of the second flexible printed circuit board.

4. The portable terminal of claim 3, further comprising an electrical element mounted on a portion of the second flexible printed circuit board and being covered by the first flexible printed circuit board.

5. The portable terminal of claim 1, wherein the first flexible printed circuit board and the second flexible printed circuit board are formed to be symmetrical to each other with respect to the folding portion.

6. The portable terminal of claim 1, further comprising:
   an external insulating layer attached to an outer surface of the first flexible printed circuit board and an outer surface of the second flexible printed circuit board.

* * * * *